(12) United States Patent
Shin et al.

(10) Patent No.: US 11,940,462 B2
(45) Date of Patent: Mar. 26, 2024

(54) TEST SOCKET ASSEMBLY

(71) Applicants: Jong Choen Shin, Gyeonggi-do (KR); Dong Ho Ha, Gyeonggi-do (KR)

(72) Inventors: Jong Choen Shin, Gyeonggi-do (KR); Dong Ho Ha, Gyeonggi-do (KR)

(*) Notice: Subject to any disclaimer, the term of this patent is extended or adjusted under 35 U.S.C. 154(b) by 240 days.

(21) Appl. No.: 17/614,290

(22) PCT Filed: Dec. 24, 2020

(86) PCT No.: PCT/KR2020/019065
§ 371 (c)(1),
(2) Date: Nov. 24, 2021

(87) PCT Pub. No.: WO2021/137527
PCT Pub. Date: Jul. 8, 2021

(65) Prior Publication Data
US 2022/0252639 A1 Aug. 11, 2022

(30) Foreign Application Priority Data
Dec. 30, 2019 (KR) .................. 10-2019-0177991

(51) Int. Cl.
*G01R 1/04* (2006.01)
*G01R 31/28* (2006.01)
*H01R 13/73* (2006.01)

(52) U.S. Cl.
CPC ....... *G01R 1/0416* (2013.01); *G01R 31/2851* (2013.01); *H01R 13/73* (2013.01)

(58) Field of Classification Search
CPC .. G01R 1/0416; G01R 1/0735; G01R 31/285; G01R 31/288; G01R 1/07357;
(Continued)

(56) References Cited

U.S. PATENT DOCUMENTS

| | | | | |
|---|---|---|---|---|
| 4,683,423 A | * | 7/1987 | Morton | G01R 1/0483 |
| | | | | 439/165 |
| 5,036,381 A | * | 7/1991 | Lin | H01L 24/97 |
| | | | | 257/693 |

(Continued)

FOREIGN PATENT DOCUMENTS

| | | |
|---|---|---|
| KR | 10-0892606 | 4/2009 |
| KR | 10-1490498 | 2/2015 |

(Continued)

OTHER PUBLICATIONS

International Search Report dated Apr. 19, 2021 for PCT/KR2020/019065.

*Primary Examiner* — Christopher P McAndrew

(57) ABSTRACT

A test socket assembly which can stably transmit a signal at high communication speed comprises: a test socket having a plurality of conductive parts for electrically connecting a device terminal of the device to be tested and a board terminal of the tester board; a guide housing including a housing body having a housing opening into which the device to be tested can be inserted, and a socket supporting section disposed beneath the housing opening so as to protrude from one surface of the housing body; and a socket frame including a frame body, which is coupled to the test socket so as to be secured to the socket supporting section so that the test socket is supported beneath the housing opening, and a frame wing which is bent from the frame body toward the housing body so as to be secured to the housing body.

5 Claims, 6 Drawing Sheets

(58) Field of Classification Search
CPC ...... G01R 1/045; G01R 1/0466; H01R 13/73; H01R 12/00
USPC .................................................. 324/756.05
See application file for complete search history.

(56) References Cited

U.S. PATENT DOCUMENTS

| | | | |
|---|---|---|---|
| 5,114,880 A * | 5/1992 | Lin | H01L 21/4842 257/668 |
| 5,180,976 A * | 1/1993 | Van Loan | G01R 1/0425 439/70 |
| 2005/0048807 A1* | 3/2005 | Li | H01L 24/72 257/E23.068 |

FOREIGN PATENT DOCUMENTS

| KR | 10-1535229 | 7/2015 |
|---|---|---|
| KR | 10-2060083 | 12/2019 |
| KR | 10-2089653 | 3/2020 |

\* cited by examiner

< Prior Art >

TEST SOCKET ASSEMBLY

This application claims the priority of Korean Patent Application No. 10-2019-0177991, filed on Dec. 30, 2019 in the KIPO (Korean Intellectual Property Office), the disclosure of which is incorporated herein entirely by reference. Further, this application is the National Stage application of International Application No. PCT/KR2020/019065, filed on Dec. 24, 2020, which designates the United States and was published in Korean. Each of these applications is hereby incorporated by reference in their entirety into the present application.

TECHNICAL FIELD

The present disclosure relates to a test socket assembly, and more particularly, to a test socket assembly capable of transmitting an electrical signal between a device under test and a tester board.

BACKGROUND ART

After a process for manufacturing a semiconductor device is completed, it is necessary to test the semiconductor device. When performing a test for the semiconductor device, a test socket configured to electrically connect a test equipment and the semiconductor device is required. In the test process, the test socket is an intermediary component by which a signal generated from a tester can be transmitted to the semiconductor device.

In order to perform a reliable test of the semiconductor device, it is necessary to accurately align a terminal of the semiconductor device and the test socket to each other. When testing the semiconductor device, a device guide is employed so as to accurately position the semiconductor device. The device guide is installed on a tester board to guide the semiconductor device to the correct position on the test socket.

However, as the number of passive elements installed on the tester board is increased, it is becoming increasingly difficult to install the device guide on the tester board.

In the case of a test socket using a pogo pin, it is easy to manufacture the pogo pin higher than the height of the passive element. Therefore, in the case of a pogo pin type test socket, it is not difficult to manufacture a device guide suitable for the pogo pin.

However, when a semiconductor device using a frequency for 5G or higher frequency (usually 2 GHz or higher) is being tested, the pogo pin and spring that elastically supports the pogo pin act as inductance. Therefore, it is difficult to utilize the pogo pin type test socket in the test requiring a communication speed of 1 GHz or higher.

In order to overcome the limitation of the pogo pin type test socket, an anisotropic electro-conductive socket is employed. However, the conventional anisotropic electro-conductive socket has a disadvantage in that it is impossible to manufacture it having a height of 1 mm or more.

In order to solve the above problem, a test socket 1 as shown in FIG. 1 has been proposed.

The conventional test socket 1 as shown in FIG. 1 has a configuration in which: a lower anisotropic electro-conductive socket 2 having a height of about 500 μm is disposed at a position facing an electro-conductive pad of a tester board, a PCB 3 having a height of about 1,000 to 4,000 μm is placed on the lower anisotropic electro-conductive socket, and an upper anisotropic electro-conductive socket 4 which may come into direct contact with a semiconductor device is stacked on the PCB. By taking a multi-layered structure, this conventional test socket 1 may be manufactured to have a height equal to or greater than a height of the passive element.

However, in the conventional test socket 1 as shown in FIG. 1, a distance from the lower anisotropic electro-conductive socket 2 to the PCB 3 is 1,500 to 4,500 μm or more, and since the PCB 3 is utilized, the frequency characteristics is deteriorated. Therefore, the conventional test socket 1 is generally applicable only at a communication speed of 2 GHz or less.

In addition, since the conventional test socket 1 has a stacked structure consisting of a plurality of elements, it has drawbacks in that since there are many contact points between elements, electrical resistance is increased, and manufacturing cost is increased.

DISCLOSURE OF THE INVENTION

Technical Problem

An object of the present disclosure is to provide a test socket assembly having simple structure and providing stale signal transmission under a high-speed communication speed.

Technical Solution

In order to solve the above-mentioned problems, a test socket assembly provided for transmitting an electrical signal between a device under test and a tester board, according to the present disclosure may include a test socket having a plurality of electro-conductive parts configured to electrically connect a device terminal of the device under test and a board terminal of the tester board to each other; a guide housing provided with a housing body having a housing opening into which the device under test can be inserted, and a socket supporting part disposed below the housing opening to protrude from one surface of the housing body; and a socket frame provided with a frame body coupled to the test socket and secured to the socket supporting part, so as to support the test socket for allowing the test socket to be placed below housing opening, and a frame wing bent from the frame body toward the housing body and secured to the housing body.

The frame wing may include a connection wing bent from an edge of the frame body toward the housing body, and a fixing wing bent from the connecting wing in a direction away from the housing opening and secured to the housing body.

The connection wing may be bent from the frame body so as to be perpendicular with respect to the frame body, and the fixing wing may be bent from the connection wing so that it may come into surface-contact with the housing body.

A mounting groove in which the fixing wing may be accommodated may be formed in the guide housing. The mounting groove may be formed in an upper surface of the housing body or partially in an upper surface of the housing body and partially in a lower surface of the housing body.

The test socket assembly according to the present disclosure may further include a fixing member inserted into an insertion hole formed in the guide housing to come into contact with the frame wing, thereby enabling the frame wing to be attached to and detached from the guide housing. The fixing member may be inserted from insertion hole from the upper side of the body or from the lower side of the body.

A coupling groove may be provided in one of the socket supporting part and the frame body, and a fixing protrusion inserted into the coupling groove may be provided in the other one of the socket supporting part and the frame body.

The electro-conductive part may include an elastic insulating material and a plurality of electro-conductive particles contained in the elastic insulating material.

The guide housing may include a plurality of housing legs protruding from one end of the housing body, and the housing legs are coupled to the tester board to allow the housing body to be spaced from the tester board.

Advantageous Effects

In the test socket assembly according to the present disclosure, since the test socket having the electro-conductive part for transmitting the signal is mounted to the socket supporting part protruding from the housing body of the guide housing to which the tester board is installed, the test socket may come into smooth contact with the board terminal without interfering with the passive element installed on the tester board. Therefore, it is possible to stably transmit the signal to the test socket having a single-layered structure without utilizing the conventional test socket having a multi-layered structure in which a plurality of elements is stacked. In addition, by employing the test socket having a single-layered structure, this test socket may be utilized for a test requiring a high-speed communication speed.

In addition, in the test socket assembly according to the present disclosure, the test socket may be simply coupled to the guide housing through the socket frame having a bent structure. Therefore, the structure is simple, the manufacturing cost may be reduced, and the manufacturing time may be shortened.

BEST MODE FOR CARRYING OUT THE INVENTION

Hereinafter, a test socket assembly according to the present disclosure is described in detail with reference to the drawings.

Figure 1:
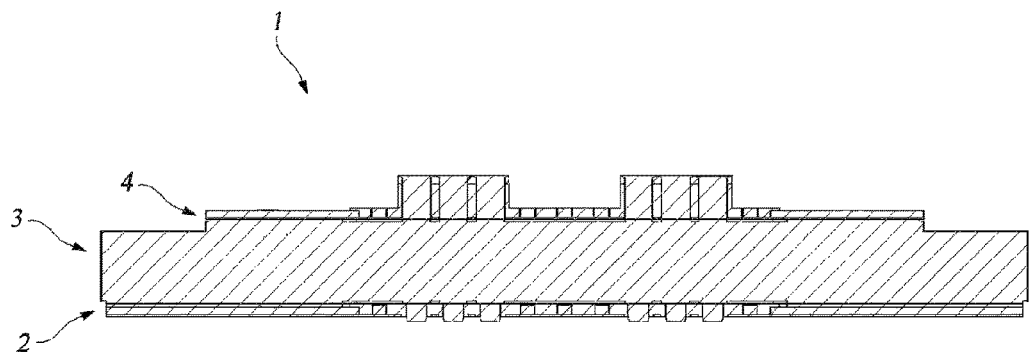
FIG. 1 shows a conventional test socket.
Figure 2:
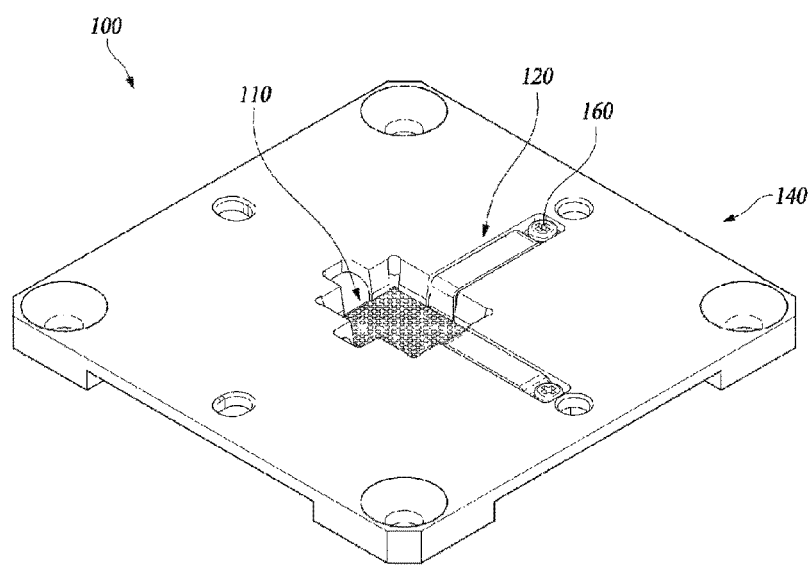
FIGS. 2 and 3 are perspective views showing a test socket assembly according to one embodiment of the present disclosure.
Figure 3:
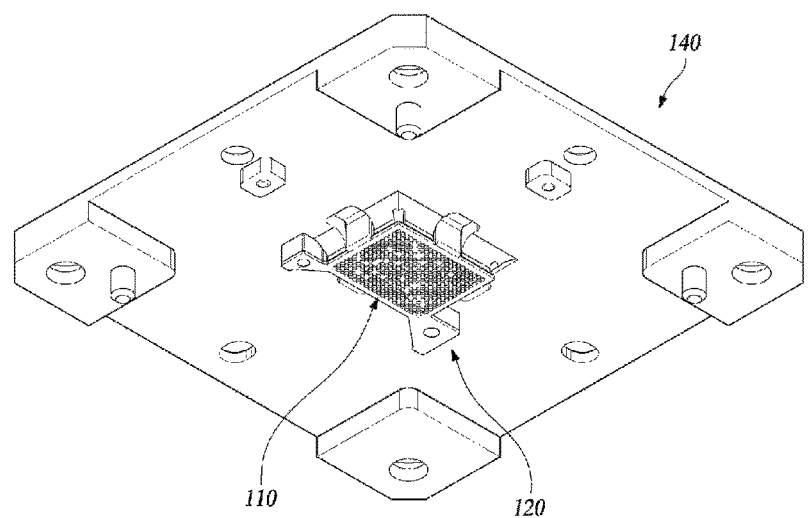
Figure 4:
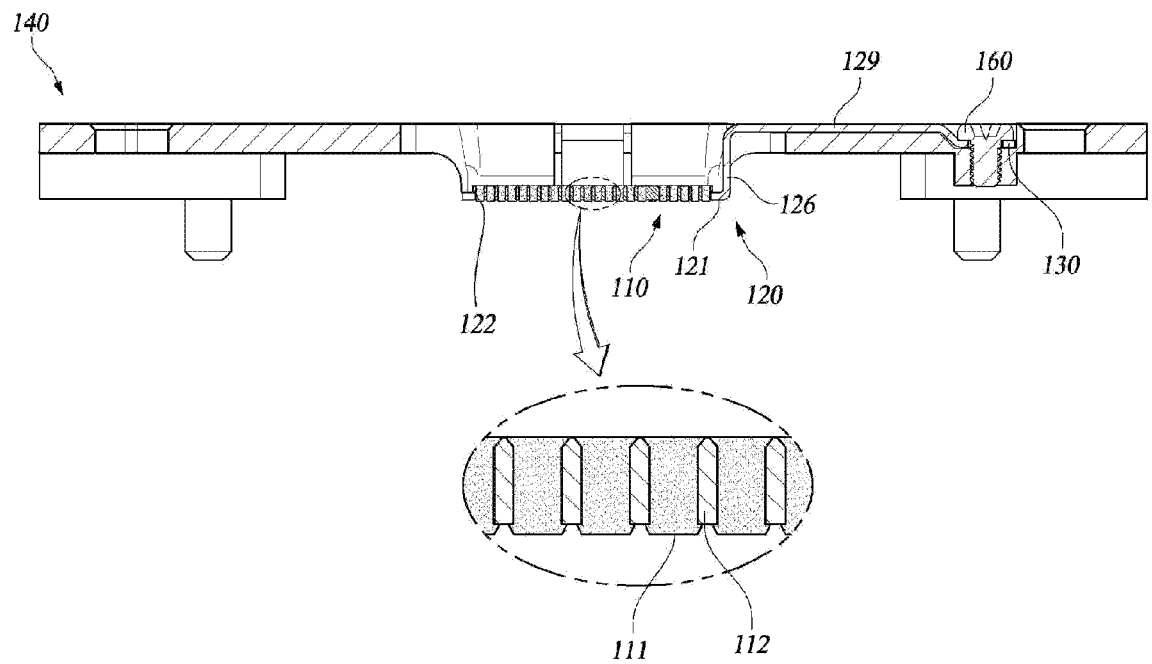
FIG. 4 is a cross-sectional view showing the test socket assembly according to one embodiment of the present disclosure.
Figure 5:
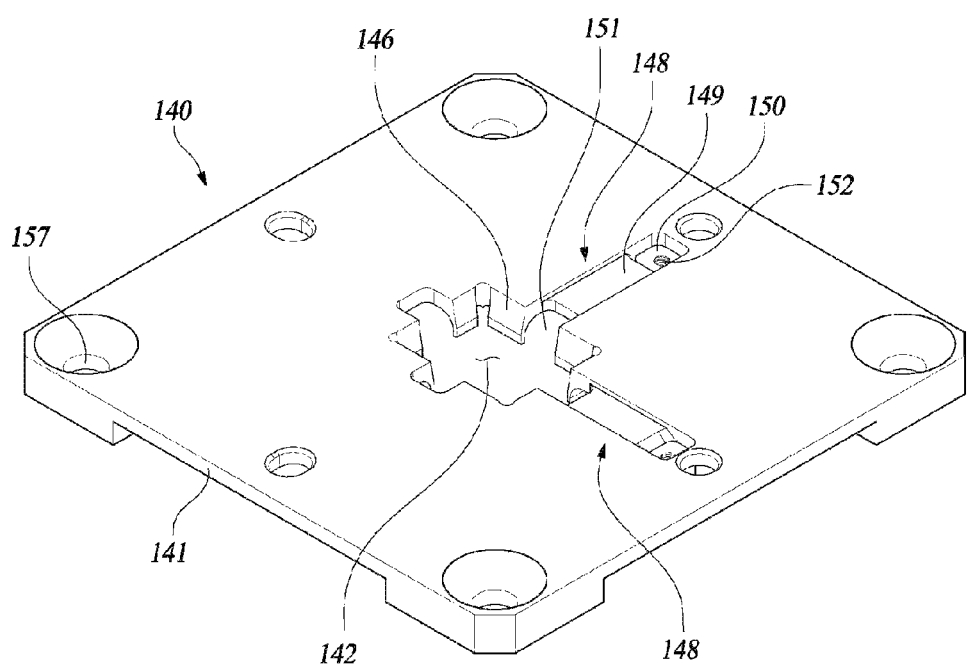
FIG. 5 is a perspective view showing a guide housing of the test socket assembly according to one embodiment of the present disclosure.
Figure 6:
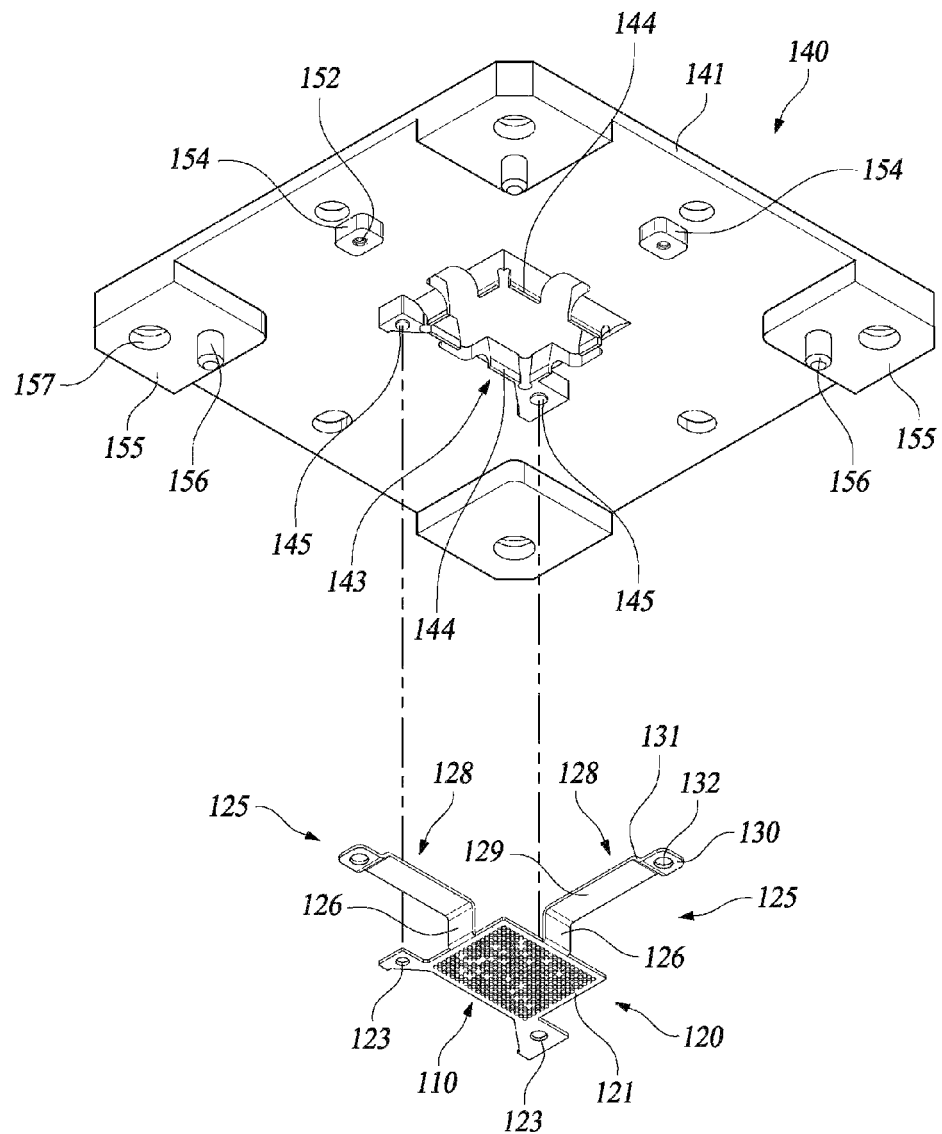
FIGS. 6 and 7 are views for explaining an assembling process of the test socket assembly according to one embodiment of the present disclosure.
Figure 7:
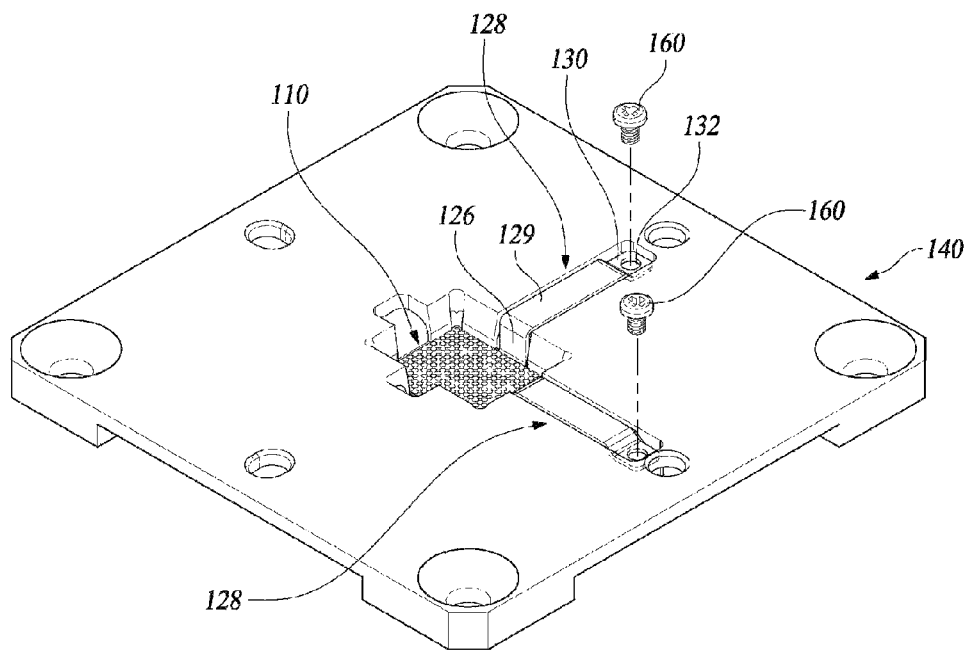
Figure 8:
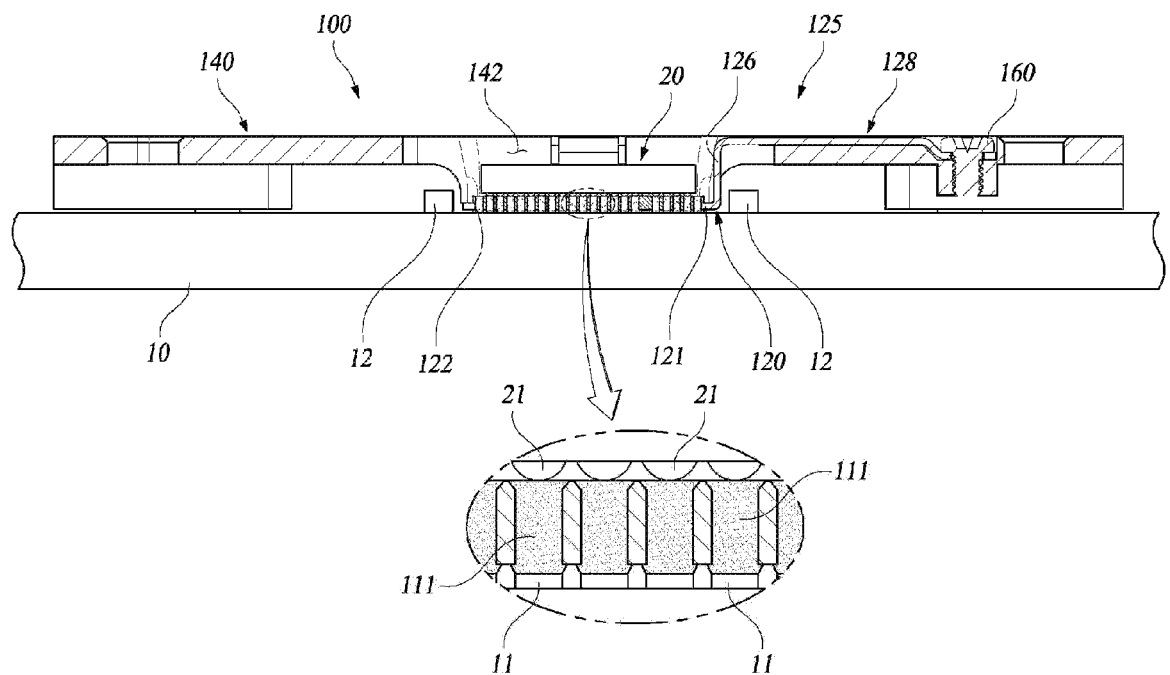
FIG. 8 is a view showing a use state in which the test socket assembly according to one embodiment of the present disclosure is used.

FIGS. 2 and 3 are perspective views showing a test socket assembly according to one embodiment of the present disclosure, FIG. 4 is a cross-sectional view showing the test socket assembly according to one embodiment of the present disclosure, FIG. 5 is a perspective view showing a guide housing of the test socket assembly according to one embodiment of the present disclosure, FIGS. 6 and 7 are views for explaining an assembling process of the test socket assembly according to one embodiment of the present disclosure, and FIG. 8 is a view showing a use case in which the test socket assembly according to one embodiment of the present disclosure is used.

As illustrated in the drawings, a test socket assembly 100 according to one embodiment of the present disclosure is provided for transmitting an electrical signal between a device 20 under test and a tester board 10 (See FIG. 8), and includes a test socket 110 configured to transmit the electrical signal, a socket frame 120 coupled to the test socket 110, and a guide housing 140 installed on the tester board 10 to guide the device 20 under test.

The test socket 110 includes a plurality of electro-conductive parts 111 electrically connecting a device terminal 21 of the device 20 under test and a board terminal 11 of the tester board 10, and an insulating part 112 (See FIG. 4) surrounding the plurality of electro-conductive parts 111 and supporting the plurality of electrically-conductive parts 111 to be spaced apart from each other The electro-conductive part 111 includes an elastic insulating material and a plurality of electro-conductive particles contained in the elastic insulating material. The electro-conductive part 111 electrically connects the device terminal 21 of the device 20 under test and board terminal 11 of the tester board 10 to be capable of transmitting the electrical signal between the device 20 under test and the tester board 10.

As an elastic insulating material constituting the electro-conductive part 111, a heat-resistant polymer material having a crosslinked structure, for example, silicone rubber, polybutadiene rubber, natural rubber, polyisoprene rubber, styrene-butadiene copolymer rubber, acrylonitrile-butadiene copolymer rubber, styrene-butadiene-diene block copolymer rubber, styrene-isoprene block copolymer rubber, urethane rubber, polyester rubber, epichlorohydrin rubber, ethylene-propylene copolymer rubber, ethylene-propylene-Diene copolymer rubber, soft liquid epoxy rubber, and the like may be employed.

In addition, for the electro-conductive particles constituting the electro-conductive part 111, particles having magnetism may be employed such that they may be reacted by a magnetic field. For example, as the electro-conductive particles, particles obtained by plating a surface of core particle, for example, particles of metals exhibiting magnetism, such as iron, nickel, cobalt, etc., or alloy particles thereof, or particles containing these metals, or particles of these metals, with a metal having excellent electrical-conductivity, such as gold, silver, palladium, radium, or the like; particles obtained by plating a surface of a core particle, for example, non-magnetic metal particles, inorganic substance particles such as glass beads or the like, and polymer particles, with electro-conductive magnetic substance such as nickel, cobalt, or the like; or particles obtained by plating core particle with electro-conductive magnetic substance and a metal having excellent electrical-conductivity may be employed.

The insulating part 112 is made of an elastic insulating material and surrounds the plurality of electro-conductive parts 111 to support the plurality of conductive parts 111 to be spaced apart from each other. The elastic insulating material of the insulating part 112 may be made of the same material as the elastic insulating material of the electro-conductive part 111.

Besides the configuration including the plurality of electro-conductive parts 111, each of which including a plurality of electro-conductive particles contained in an elastic insulating material, and the insulating part 112 surrounding the plurality of conductive parts 111 as shown in the drawings, the test socket 100 may be altered into various different configurations. As another example, the test socket may be altered to have a pogo pin type configuration. As still another example, the test socket may have a configuration disclosed in Korean Patent Registration No. 1410866.

The socket frame 120 is coupled to the test socket 110 to secure the test socket 110 to the guide housing 140 (See FIG. 6). The socket frame 120 includes a frame body 121 secured to a socket supporting part 143 provided in the guide housing 140, and a frame wing 125 bent from the frame body 121 and secured to a housing body 141 of the guide housing 140.

The frame body 121 is formed to have a flat plate shape supporting the test socket 110. A frame through hole 122 (FIGS. 4, 8) is provided in the frame body 121, and a lower end of the electro-conductive part 111 of the test socket 110 may be exposed to a lower side of the frame body 121 through the frame through hole 122. The lower end portion of the electro-conductive part 111 exposed to the lower side of the frame body 121 comes into contact with the board terminal 11 of the tester board 10 to be electrically connected to the board terminal 11. The test socket 110 may be coupled to the frame body 121 in various ways such as a bonding method using an adhesive, and the like.

The frame body 121 is provided with a coupling hole 123 (FIG. 6) formed therein. When the frame body 121 is coupled with the socket supporting part 143 of the guide housing 140, a fixing protrusion 145 provided in the socket supporting part 143 is inserted into the coupling hole 123. Accordingly, it is possible to maintain a state in which the frame body 121 is stably coupled with the socket supporting part 143.

By securing the frame wings 125 to the housing body 141, the frame body 121 is stably coupled to the socket supporting part 143. The frame wing 125 includes a connection wing 126 bent from the frame body 121 and a fixing wing 128 bent from the connection wing 126. The connection wing 126 is bent from the frame body 121 so as to be angled with respect to the frame body 121, and the fixing wing 128 is bent from the connection wing 126 so that it may come into surface-contact with the housing body 141. That is, the connection wing 126 is bent approximately perpendicularly from an edge of the frame body 121, and the fixing wing 128 is bent approximately perpendicularly from the connection wing 126 and secured to the housing body 141.

The fixing wing 128 includes a first fixing section 129, a second fixing section 130, and a connection section 131. The first fixing section 129 is connected to the connection wing 126, and the second fixing section 130 is connected to the first fixing section 129 through the connection section 131. The connection section 131 is bent obliquely from the first fixing section 129, and the second fixing section 130 is bent from the connection section 131 to be disposed substantially parallel with the first fixing section 129. A frame wing hole 132 is provided in the second fixing section 130. A fixing member 160 (e.g., screw, See FIG. 7) for securing the frame wing 125 to the guide housing 140 may be inserted into the frame wing hole 132.

By securing the fixing wing 128 to the guide housing 140 using the fixing member 160, the frame wing 125 may stably support the frame body 121 coupled to the socket supporting part 143. That is, the frame wing 125 secured to the housing body 141 may apply an elastic force to the frame body 121 in a direction in which the frame body 121 comes into close contact with the socket supporting part 143. Accordingly, it is possible to maintain a state in which the frame body 121 is stably coupled to the socket supporting part 143, and a state in which the test socket 110 coupled to the frame body 121 is stably coupled to the socket supporting part 143.

The socket frame 120 may be made of various materials that may be bent and deformed. For example, the socket frame may be made of plastic or metal. As plastic which may be used for manufacturing the socket frame 120, polyimide, which is resistant to deformation in various environments and has excellent flexibility, may be employed.

When the socket frame 120 is manufactured, by bending the frame wing 125 extending from the frame body 121 several times, the connection wing 126, the first fixing section 129, the second fixing section 130, and the connection section 131 may be formed. In the process of bending the frame wing 125, if notches are formed in various shapes at portions to be bent, a bending operation may be performed more easily. In addition, if the notch is formed in the frame wing 125, it is possible to prevent the bent portion from being easily unfolded.

The guide housing 140 is installed on the tester board 10 (FIG. 8) to support the test socket 110, and guide the device 20 under test to the test socket 110. The guide housing 140 is provided with a housing body 141 having a housing opening 142 into which the device 20 under test may be inserted, and the socket supporting part 143 (FIG. 6) protruding from one surface of the housing body 141 to enable it to support the test socket 110. The housing opening 142 is formed in an intermediate portion of the housing body 141 to pass through the housing body 141. The housing opening 142 may have a shape corresponding to a shape of the device 20 under test so that the device 20 under test may be inserted thereinto.

The socket supporting part 143 may protrude downward from the housing opening 142 to support the test socket 110 so as to be placed under the housing opening 142. The socket supporting part 143 includes a plurality of supporting protrusions 144 protruding from a periphery of the housing opening 142. The supporting protrusion 144 is provided with a guide section 146 (FIG. 5) for guiding the device 20 under test toward the test socket 110. When the device 20 under test is inserted into the housing opening 142, the guide section 146 may come into contact with an edge of the device 20 under test. Accordingly, the device 20 under test may be guided by the guide section 146 to approach the test socket 110 in an upright posture.

The socket supporting part 143 is provided with a fixing protrusion 145 (FIG. 6) protruding downward, and this fixing protrusion may be inserted into the coupling hole 123 of the socket frame 120. The fixing protrusion 145 is inserted into the coupling hole 123 of the frame body 121 when the frame body 121 is coupled to the socket supporting part 143. By inserting the fixing protrusion 145 into the coupling hole 123, the frame body 121 is not easily detached from the socket supporting part 143, so it is possible to maintain a state in which the frame body is stably coupled to the socket supporting part 143.

A mounting groove 148 (FIG. 5) in which the fixing wing 128 of the socket frame 120 may be accommodated is formed in the housing body 141. As the fixing wing 128 is inserted into the mounting groove 148 and secured by the fixing member 160, it is possible to maintain a state in which the fixing wing 128 is stably coupled to the housing body 141 without movement of the fixing wing. In addition, since the fixing wing 128 is inserted into the mounting groove 148, the fixing wing 128 does not protrude from the housing body 141. If the fixing wing 128 does not protrude from the housing body 141, the risk of damage to the fixing member 160 is reduced.

The mounting groove 148 includes a first accommodation groove 149 in which the first fixing section 129 of the fixing wing 128 is accommodated, and a second accommodation groove 150 in which the second fixing section 130 of the fixing wing 128 is accommodated. A depth of the second accommodation groove 150 is greater than a depth of the first accommodation groove 149. The fixing member 160 inserted into the frame wing hole 132 of the second fixing section 130 may be accommodated in the second accommodation groove 150.

As the fixing member 160 is accommodated in the second accommodation groove 150, the fixing member 160 may be secured to the housing body 141 without protruding from an upper surface of the housing body 141. The fixing member 160 may be inserted into an insertion hole 152, which is in communication with the second accommodation groove 150, to be secured to the guide housing 140. The fixing member 160 passes through the frame wing hole 132 of the second fixing section 130 and is then inserted into the insertion hole 152, so the fixing member come into contact with the second fixing section 130 and may enable the second fixing section 130, including the socket frame 120 and the test socket 110, to be detached from and attached to the guide housing 140.

As illustrated, when the fixing member 160 has a bolt structure, a female thread may be formed in the insertion hole 152. As the fixing member 160 having a bolt structure may be screwed into the insertion hole 152, it is possible for the fixing wing 128 to be firmly secured to the guide housing 140.

A connection groove 151 (FIG. 5) is formed between the housing opening 142 and the first accommodation groove 149. The connection wing 126 of the frame wing 125 may be inserted into the connection groove 151. As the connection wing 126 is inserted into the connection groove 151, it does not protrude further inward than the guide section 146 of the guide housing 140. In addition, since the connection wing 126 does not protrude to the inside of the housing opening 142, the connection wing 126 does not interfere with the device 20 under test which is being inserted into the housing opening 142, and does not obstruct the entry and exit of the device 20 under test.

Additionally, the guide housing 140 includes a boss section 154 and housing legs 155

The boss section 154 (FIG. 6) is provided to protrude from the housing body 141 at a position corresponding to the insertion hole 152 to provide sufficient thickness for fixing member 160 to be secured to. The insertion hole 152 is formed to pass through a lower end portion of the boss section 154 from the upper surface of the housing body 141.

Housing legs 155 protrude from one surface of the housing body 141 in a direction which is the same as socket supporting part 143. A plurality of housing legs 155 are provided at corners of the housing body 141, and may be coupled to the tester board 10. The plurality of housing legs 155 may be coupled to the tester board 10 to space the housing body 141 apart from the tester board 10.

The housing leg 155 may be provided with a locating pin 156 and housing through holes 157. By inserting the locating pins 156 into holes (not shown) provided in the tester board 10, it is possible to determine an orientation and position on the tester board 10 at which the guide housing 140 is coupled. The housing through hole 157 is formed to pass through a lower end portion of the housing leg 155 from the upper surface of the housing body 141. A fixing member (not shown) for securing the guide housing 140 to the tester board 10 may be inserted into the housing through hole 157.

The test socket assembly 100 may be assembled in the same manner as that shown in FIG. 6 and FIG. 7.

Firstly, the test socket 110 is coupled to the socket frame 120, and the socket frame 120 to which the test socket 110 is coupled is assembled to the guide housing 140. When the socket frame 120 is assembled to the guide housing 140, the frame body 121 is mounted to the socket supporting part 143 so that the fixing protrusion 145 of the socket supporting part 143 is inserted into the coupling hole 123 of the frame body 121. Then, the fixing wing 128 is mounted in the mounting groove 148 of the guide housing 140. Since the frame wing 125 is elastically deformable, an operation of mounting the fixing wing 128 to the mounting groove 148 may be easily performed. Thereafter, the fixing member 160 passes through the frame wing hole 132 of the fixing wing 128 and is inserted into the insertion hole 152 of the guide housing 140, so the socket frame 120 may be firmly secured to the guide housing 140.

At this time, the frame wing 125 may apply an elastic force to the frame body 121 in a direction in which the frame body 121 comes into close contact with the socket supporting part 143. Therefore, it is possible to maintain a state in which the frame body 121 is stably coupled to the socket supporting part 143, and it is also possible to maintain a state in which the test socket 110 coupled to the frame body 121 is stably coupled to the socket supporting part 143.

As shown in FIG. 8, the test socket assembly 100 may be installed on the tester board 10 to transmit an electrical signal between the device 20 under test and the tester board 10. At this time, the housing legs 155 of the guide housing 140 are secured to the tester board 10, so it is possible to support the housing body 141 such that the housing body is spaced apart from the tester board 10. In addition, the test socket 110 mounted to the socket supporting part 143 protruding from the housing body 141 may come into contact with the plurality of board terminals 11 provided on the tester board 10. As described above, since the test socket 110 is mounted to the socket supporting part 143 protruding from the housing body 141, the test socket 110 may be smoothly connected to the board terminal 11 without interfering with passive elements 12 installed on the test board 10 and adjacent to the board terminal 11.

When an electrical test for the device 20 under test is being performed, the device 20 under test is transported over the test socket 110 by a picker (not shown). At this time, the guide housing 140 may guide the device 20 under test over the test socket 110. Accordingly, the device terminal 21 of the device 20 under test may stably come into contact with the electro-conductive part 111 of the test socket 110.

As described above, in the test socket assembly 100 according to one embodiment of the present disclosure, since the test socket 110 having the electro-conductive part 111 for transmitting the signal is mounted to the socket supporting part 143 protruding from the housing body 141 of the guide housing 140, the test socket 110 may be electrically connected to the board terminal 11 without interfering with the passive element 12 installed on the tester board 10. Therefore, it is possible to stably transmit the signal to the test socket 110 having a single-layered structure without using the conventional test socket having a multi-layered structure in which a plurality of elements is stacked. In addition, by employing the test socket 110 having a single-layered structure, this test socket may be utilized for a test requiring a high-speed communication speed.

Additionally, in the test socket assembly 100 according to one embodiment of the present disclosure, the test socket 110 may be simply coupled to the guide housing 140 through the socket frame 120 having a bent structure. Therefore, the structure is simple, the manufacturing cost may be reduced, and the manufacturing time may be shortened.

Figure 9:
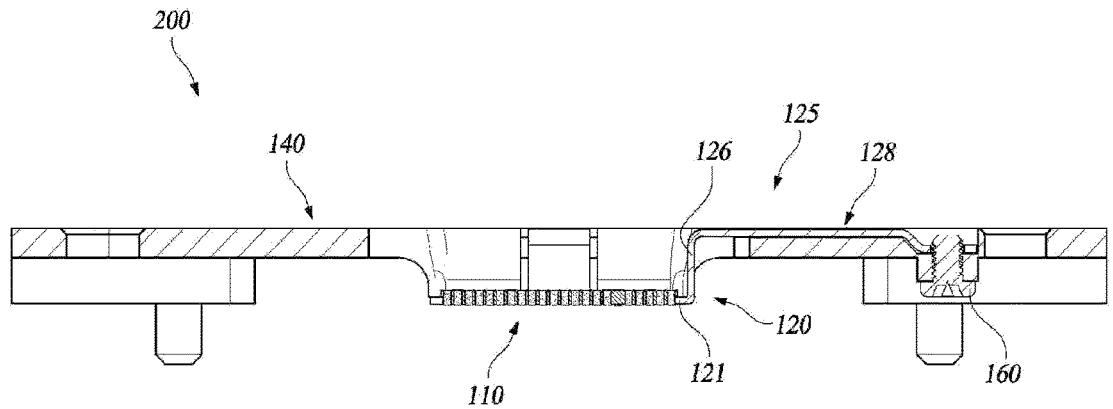
FIG. 9 is a cross-sectional view showing a test socket assembly according to another embodiment of the present disclosure.

Turning now to FIG. 9, a cross-sectional view showing a test socket assembly according to another embodiment of the present disclosure is shown.

A test socket assembly 200 shown in FIG. 8 includes the test socket 110 configured to transmit the electrical signal, the socket frame 120 coupled to the test socket 110, the guide housing 140 installed on the tester board 10 to guide the device 20 under test, and the fixing member 160 provided for securing the frame wing 125 of the socket frame 120 to the guide housing 140.

The test socket assembly 200 has a configuration in which a coupling direction of the fixing member 160 is changed compared to the test socket assembly 100 which was previously described. That is, the fixing member 160 is inserted into the insertion hole 152 from the lower end portion of the boss section 154, passes through the insertion hole 152, and may be coupled to the frame wing hole 132 of the frame wing 125.

Above this, in addition to the bolt structure as shown, the fixing member may be modified into various other configurations in which the fixing member may be coupled to the guide housing 140 to secure the frame wing 125 to the guide housing.

Figure 10:
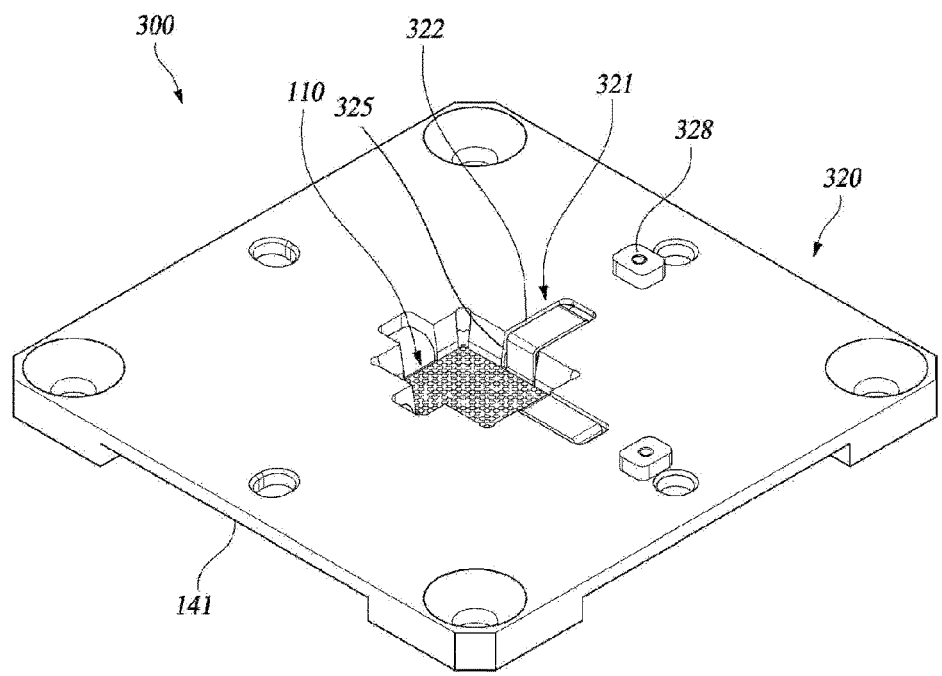
FIG. 10 is a perspective view showing a test socket assembly according to still another embodiment of the present disclosure.
Figure 11:
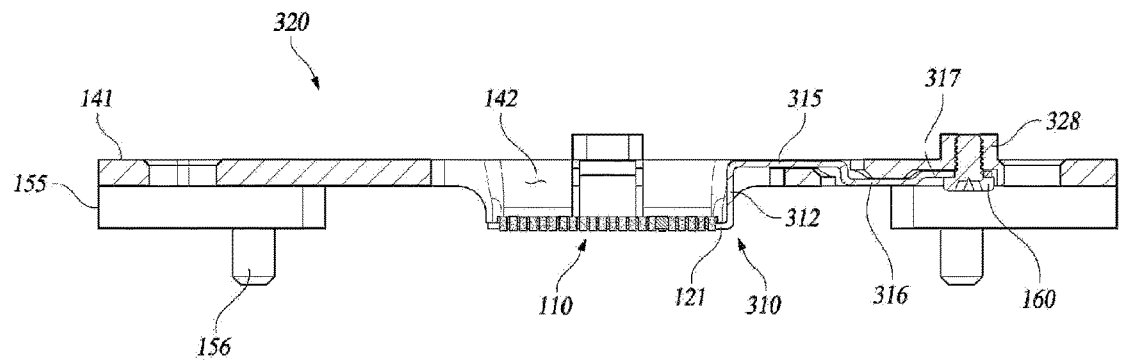
FIG. 11 is a cross-sectional view showing the test socket assembly according to still another embodiment of the present disclosure.
Figure 12:
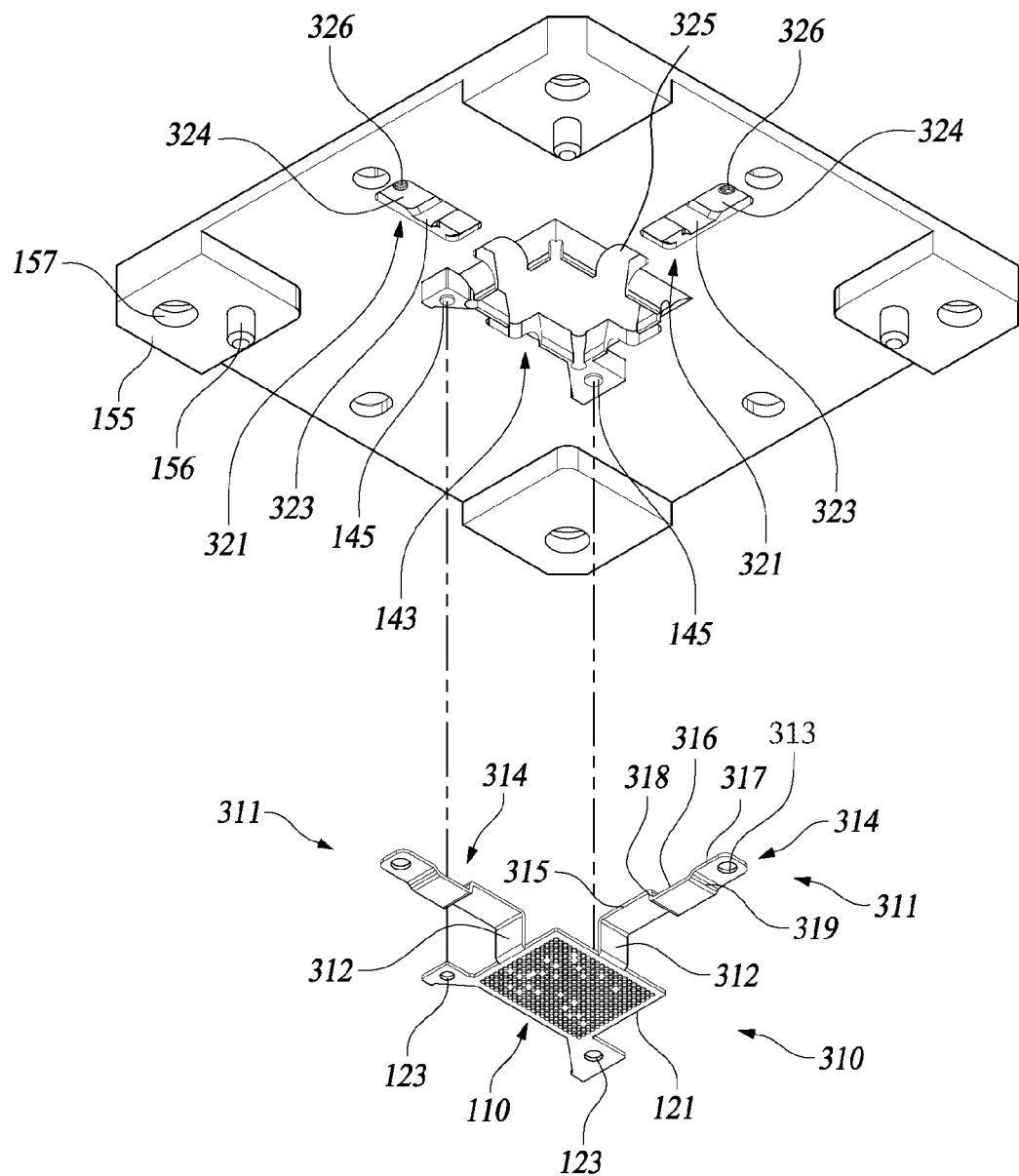
FIG. 12 is a view for explaining an assembling process of the test socket assembly according to still another embodiment of the present disclosure.

Turning now to FIGS. 10-12, FIG. 10 is a perspective view showing a test socket assembly according to still another embodiment of the present disclosure, FIG. 11 is a cross-sectional view showing the test socket assembly according to still another embodiment of the present disclosure, and FIG. 12 is a view for explaining an assembling process of the test socket assembly according to still another embodiment of the present disclosure.

A test socket assembly 300 shown in FIGS. 10 to 12 includes the test socket 110 configured to transmit the electrical signal, a socket frame 310 coupled to the test socket 110, a guide housing 320 installed on the tester board 10 to guide the device 20 under test, and the fixing member 160 configured to secure the socket frame 310 to the guide housing 320. As compared with the test socket assembly 100 described above, in this test socket assembly 300, some configurations of the socket frame 310 and the guide housing 320 are modified; however, the test socket 110 is the same as the test socket described above.

The socket frame 310 includes the frame body 121 secured to the socket supporting part 143 provided on the guide housing 320, and a frame wing 311 bent from the frame body 121 and secured to the housing body 141 of the guide housing 320. Here, as previously described, the frame body 121 is coupled to the test socket 110 and secured to the socket supporting part 143.

The frame wing 311 is bent from the frame body 121 toward the housing body 141 and is secured to the housing body 141. The frame wing 311 includes a connection wing 312 bent from the frame body 121 and a fixing wing 314 bent from the connection wing 312. The connection wing 312 is bent approximately perpendicularly from an edge of the frame body 121. The fixing wing 314 is bent approximately perpendicularly from the connection wing 312 and secured to the housing body 141.

The fixing wing 314 includes a first fixing section 315, a second fixing section 316, and a third fixing section 317. The first fixing section 315 is connected to the connection wing 312, and the second fixing section 316 is connected to the first fixing section 315 through a first connection section 318. The first connection section 318 is inclinedly bent from the first fixing section 315. The second fixing section 316 is bent from the first connection section 318 and disposed substantially parallel to the first fixing section 315 at a position below the first fixing section 315. The third fixing section 317 is connected to the second fixing section 316 through a second connection section 319. The second connection part 319 is inclinedly bent from the second fixing section 316. The third fixing section 317 is bent from the second connection section 319 and disposed substantially parallel to the first fixing section 315 at the approximate same height as the first fixing section 315. A frame wing hole 313 is provided in the third fixing section 317. The fixing member 160 may be inserted into the frame wing hole 313. The fixing wing 314 may be firmly secured to the guide housing 320 by the fixing member 160.

The guide housing 320 includes a housing body 141 having a housing opening 142, and a socket supporting part 143 protruding from one surface of the housing body 141 to support the test socket 110. The socket supporting part 143 is the same as that previously described.

A mounting groove 321 in which the fixing wing 314 of the socket frame 310 may be accommodated is formed in the housing body 141. The mounting groove 321 includes a first accommodation groove 322 in which the first fixing section 315 of the fixing wing 314 is accommodated, a second accommodation groove 323 in which the second fixing section 316 is accommodated, and a third accommodation groove 324 in which the third fixing section 317 is accommodated. The first accommodation groove 322 is opened outwardly from the upper surface of the housing body 141, and the second accommodation groove 323 and the third accommodation groove 324 are opened outwardly from a lower surface of the housing body 141 (See FIG. 11). A depth of the third accommodation groove 324 is greater than a depth of the second accommodation groove 323. The fixing member 160 inserted into the frame wing hole 313 of the third fixing section 317 is accommodated in the third accommodation groove 324. The fixing member 160 may be inserted into an insertion hole 326, which is in communication with the third accommodation groove 324, to be secured to the guide housing 320. The insertion hole 326 extends to a boss section 328 protruding from the upper surface of the housing body 141.

A connection groove 325 is formed between the housing opening 142 and the first accommodation groove 322. The connection wing 312 of the frame wing 311 may be inserted into the connection groove 325. Since the connection wing 312 is inserted into the connection groove 325, the connection wing 312 does not protrude inward further than the guide section 146 of the guide housing 320.

The test socket assembly 300 described above may be assembled in such a way that the socket frame 310 is coupled to the guide housing 320 in a state in which the test socket 110 is coupled to the socket frame 310. When assembling the socket frame 310 to the guide housing 320, the frame body 121 is mounted to the socket supporting part 143 and the fixing wing 314 is mounted to the mounting groove 321 of the guide housing 320 so that the fixing protrusion 145 of the socket supporting part 143 is inserted into the coupling hole 123 of the frame body 121. Since the frame wing 311 is elastically deformable, an operation of mounting the fixing wing 314 to the mounting groove 321 may be performed without difficulty. Thereafter, the fixing member 160 passes through the frame wing hole 313 of the fixing wing 314 from a lower portion of the housing body 141 and is inserted into the insertion hole 326 of the guide housing 320, so the socket frame 310 may be firmly secured to the guide housing 320.

At this time, since the frame wing 311 may apply an elastic force to the frame body 121 in a direction in which the frame body 121 comes into close contact with the socket supporting part 143, it is possible to maintain a state in which the frame body 121 is stably coupled to the socket supporting part 143. In addition, it is also possible to maintain a state in which the test socket 110 coupled to the frame body 121 is stably coupled to the socket supporting part 143 without movement of the test socket.

Although preferred examples of the present disclosure have been described above, the scope of the present disclosure is not limited to the forms described and illustrated above.

For example, in the drawing, although the socket frame is shown as including the frame body which the test socket 110 is coupled, and two frame wings connected to the frame body, the number of frame wings may be variously changed. Also, in addition to the configuration shown in the drawings, the frame wing may be modified to have various other configurations in which the frame wing is bent more than once.

In addition, even although the drawings show that the housing body of the guide housing installed on the tester board 10 is provided with the plurality of housing legs that may come into contact with the tester board 10, the guide housing in which the housing legs are omitted is also possible. In this case, a protrusion structure protruding from the tester board 10 may be provided on the tester board 10, so it is possible to space the housing body apart from the tester board 10 using this protrusion structure.

Furthermore, although the drawings show the socket supporting part 143 of the guide housing as including the plurality of supporting protrusions 144, the socket supporting part may be modified to have various configurations in which the socket supporting part protrudes to a lower side of the housing opening 142 to support the test socket 100 to be placed below the housing opening 142.

In addition, the drawings illustrate the configuration in which the socket supporting part 143 of the guide housing 140 is provided with the fixing protrusion 145 and the coupling hole 123 is provided on the frame body 121 of the socket frame 120, the positions of the fixing protrusions and the coupling hole may be reversed.

In the above, the present disclosure has been shown and described in connection with a preferred embodiment for illustrating the principle of the present disclosure, but the present disclosure is not limited to the configuration and operation as shown and described as above. Rather, it will be well understood by those skilled in the art that many changes and modifications can be made to the present disclosure without departing from the spirit and scope of the appended claims.

The invention claimed is:

1. A test socket assembly for transmitting an electrical signal between a device under test and a tester board, comprising:
   a test socket having a plurality of electro-conductive parts configured to electrically connect a device terminal of the device under test and a board terminal of the tester board to each other;
   a guide housing provided with a housing body having a housing opening into which the device under test can be inserted, and a socket supporting part disposed below the housing opening to protrude from one surface of the housing body; and
   a socket frame provided with a frame body coupled to the test socket and secured to the socket supporting part, so as to support the test socket for allowing the test socket to be placed below the housing opening, and a frame wing bent from the frame body toward the housing body and secured to the housing body,
   wherein the frame wing comprises:
      a connection wing bent from an edge of the frame body toward the housing body; and
      a fixing wing bent from the connecting wing in a direction away from the housing opening and secured to the housing body,
      wherein the electro-conductive part comprises an elastic insulating material and a plurality of electro-conductive particles contained in the elastic insulating material,
      wherein the guide housing comprises a plurality of housing legs protruding from one end of the housing body, and being coupled to the tester board such that the housing body may be spaced from the tester board.

2. The test socket assembly of claim 1, wherein the connection wing is bent from the frame body so as to be perpendicular with respect to the frame body, and the fixing wing is bent from the connection wing so that it may come into surface-contact with the housing body.

3. The test socket assembly of claim 2, further comprising:
   a mounting groove formed in the guide housing in which the fixing wing may be accommodated.

4. The test socket assembly of claim 1, further comprising:
   a fixing member inserted into an insertion hole formed in the guide housing to come into contact with the frame wing, thereby enabling the frame wing to be attached to and detached from the guide housing.

5. The test socket assembly of claim 1, wherein a coupling groove is provided in one of the socket supporting part and the frame body, and a fixing protrusion inserted into the coupling groove is provided in the other one of the socket supporting part and the frame body.

* * * * *